(12) United States Patent
Han

(10) Patent No.: US 7,598,583 B2
(45) Date of Patent: Oct. 6, 2009

(54) IMAGE SENSOR

(75) Inventor: Jae Won Han, Gyeongi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/782,144

(22) Filed: Jul. 24, 2007

(65) Prior Publication Data

US 2008/0048209 A1 Feb. 28, 2008

(30) Foreign Application Priority Data

Aug. 23, 2006 (KR) .................. 10-2006-0080118

(51) Int. Cl.
*H01L 31/02* (2006.01)

(52) U.S. Cl. .................. 257/444; 257/448; 257/294; 257/E31.113; 257/E31.124

(58) Field of Classification Search .................. 257/444, 257/448, 294, E31.113, E31.124
See application file for complete search history.

(56) References Cited

U.S. PATENT DOCUMENTS

| 6,274,917 B1 | 8/2001 | Fan et al. |
| 6,476,374 B1 | 11/2002 | Kozlowski et al. |
| 6,891,242 B2 * | 5/2005 | Gidon et al. ................. 257/443 |
| 7,436,012 B2 * | 10/2008 | Mori et al. .................. 257/292 |
| 7,442,572 B2 * | 10/2008 | Sohn ............................. 438/59 |
| 7,495,206 B2 * | 2/2009 | Park ........................ 250/214.1 |
| 2004/0033008 A1 | 2/2004 | Mikawa et al. |
| 2005/0253176 A1 | 11/2005 | Pyo |
| 2008/0251823 A1 * | 10/2008 | Lee ............................. 257/292 |

FOREIGN PATENT DOCUMENTS

| KR | 10-2006-0077132 | 7/2006 |
| WO | WO 2005/086236 | 9/2005 |

OTHER PUBLICATIONS

Lee, K.W. [u.a.]: Development of Three-Dimensional Integration Technology for Highly Parallel Image-Processing Chip. In: Jpn.J. Appl. Phys. vol. 39, Nr. 4B, 2000, S. 2473-2477.
Fukushima, T.[u.]:New Three-Dimensional Integration Technology Using Chip-to-Wafer Bonding to Achieve Ultimate Super-Chip Integration.In:Jpn.J.Appl.Phys., vol. 45, Nr.4B,Apr. 2006.

* cited by examiner

*Primary Examiner*—Victor A Mandala
(74) *Attorney, Agent, or Firm*—Sherr & Vaughn, PLLC

(57) ABSTRACT

An image sensor according to embodiments may include a first substrate having photodiode cells, a second substrate having a logic circuit, and connection electrodes that may electrically connect the photodiode cells with the logic circuit. In embodiments, more area may be available on the first substrate for photodiode cells and light loss may be reduced.

10 Claims, 3 Drawing Sheets

0# IMAGE SENSOR

The present application claims priority under 35 U.S.C. 119 and 35 U.S.C. 365 to Korean Patent Application No. 10-2006-0080118 (filed on Aug. 23, 2006), which is hereby incorporated by reference in its entirety.

BACKGROUND

Various attempts have been made to increase photosensitivity of image sensors. One proposal is a photo-gathering technology. For instance, a CMOS image sensor may include a photodiode to detect light and a CMOS logic circuit to convert detected light into electric signals representing data. To improve the photosensitivity, a fill factor, which may be a ratio of a photodiode area to the whole area of the image sensor, could be increased.

Because, however, the CMOS logic circuit is an essential element of an image sensor, a problem may occur if the CMOS logic circuit is removed from the image sensor. Thus, there may be limitations on improvements to the photosensitivity of the image sensor based on the limited area of the image sensor.

SUMMARY

Embodiments relate to an image sensor and a fabricating method thereof.

Embodiments relate to an image sensor and a method for manufacturing the same, capable of improving photosensitivity of the image sensor.

In embodiments, an image sensor may include a first substrate having photodiode cells, a second substrate having a logic circuit, and connection electrodes for electrically connecting the photodiode cells with the logic circuit.

In embodiments, a method of manufacturing an image sensor may include providing a first substrate having photodiode cells and a second substrate having a logic circuit, and stacking the first substrate on the second substrate and electrically connecting the photodiode cells to the logic circuit.

DRAWINGS

DESCRIPTION

According to embodiments, a first substrate may have photodiode cells and may be fabricated separately from a second substrate. The second substrate may have electrical components, for example, a logic circuit. The first substrate may be coupled or combined with the second substrate, and may form an image sensor. The photodiode cells that may be formed on the first substrate may be electrically coupled and/or connected with the logic circuit formed on the second substrate, in embodiments through connection electrodes.

Figure 1:
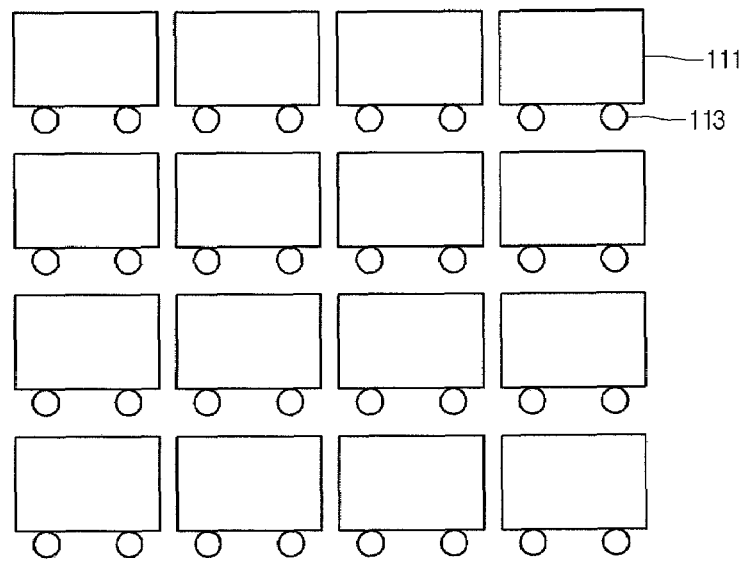
FIG. 1 is a drawing illustrating a substrate having photodiode cells formed through a method of manufacturing an image sensor according to embodiments.
Figure 2:
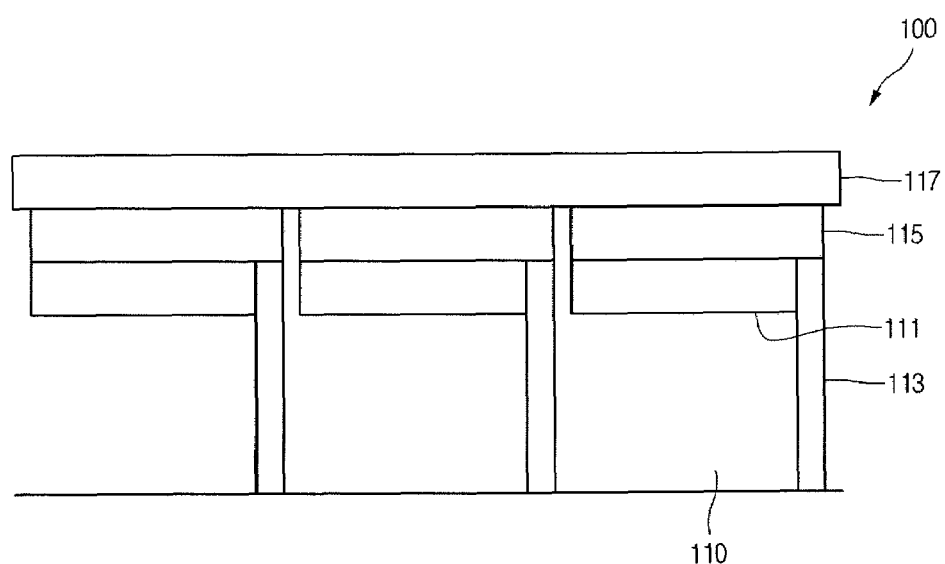
FIG. 2 is a drawing illustrating a substrate having photodiode cells formed through a method of manufacturing an image sensor according to embodiments.

FIG. 1 illustrates a substrate having photodiode cells that may be formed through a method of manufacturing an image sensor according to embodiments, and FIG. 2 illustrates a substrate having photodiode cells that may be formed through a method of manufacturing an image sensor according to embodiments.

As illustrated in FIGS. 1 and 2, photodiode cells 111, through electrodes 113, and color filters 115 may be formed on first substrate 100.

Photodiode cells 111 may be formed on an upper portion of semiconductor substrate 110. Then, through electrodes 113 may be formed such that the through electrodes 113 may be coupled and/or connected to photodiode cells 111, for example by passing through semiconductor substrate 110.

In embodiments, through electrode 113 may be formed by sequentially performing a pattern process, an etching process, and a metal forming process relative to semiconductor substrate 110. These processes are generally known in the art, so detailed description thereof will be omitted.

In embodiments, through electrode 113 may include at least one material selected from the group consisting of W, Cu, Al, Ag and Au. In embodiments, through electrode 113 may be deposited through CVD, PVD, evaporation, or ECP. In embodiments, TaN, Ta, TiN, Ti or TiSiN may be used as a barrier metal of through electrode 113. In embodiments, a barrier metal may be formed through CVD, PVD, or ALD.

Color filter 115 may be formed on photodiode cell 111 and protective layer 117 may be formed on color filter 115.

Figure 3:
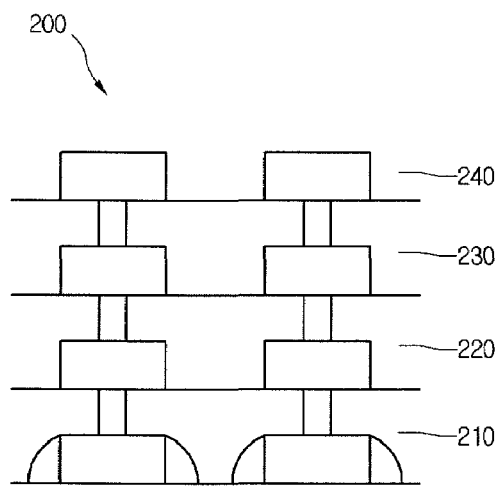
FIG. 3 is a drawing illustrating a substrate having a logic circuit formed through a method of manufacturing an image sensor according to embodiments.

FIG. 3 illustrates a substrate having a logic circuit formed through a method of manufacturing an image sensor according to embodiments.

According to embodiments, referring to FIG. 3, second substrate 200 may include transistor layer 210, first metal layer 220, second metal layer 230, and third metal layer 240.

Transistor layer 210 and first, second, and third metal layers 220, 230, and 240 may form a logic circuit that may process signals. Although embodiments may include first, second, and third metal layers 220, 230 and 240, the number of the metal layers may vary depending on the design of the semiconductor device. Hence any number of layers may be used.

In embodiments, transistors may be formed in transistor layer 210 in correspondence with photodiode cells 111 formed on first substrate 100. The transistors may be aligned in the area corresponding to a location of a photodiode cell area. According to embodiments, a number of transistors in the circuit may vary depending on applications thereof. In embodiments, the photodiode cell area may be larger than that of the related art, so the number of transistors may not be limited. Therefore, a higher number of transistors may be formed in transistor layer 210. This may improve certain characteristics of the image sensor. In embodiments, it may not be necessary to use a fine circuit forming process to provide the logic circuit.

Figure 4:
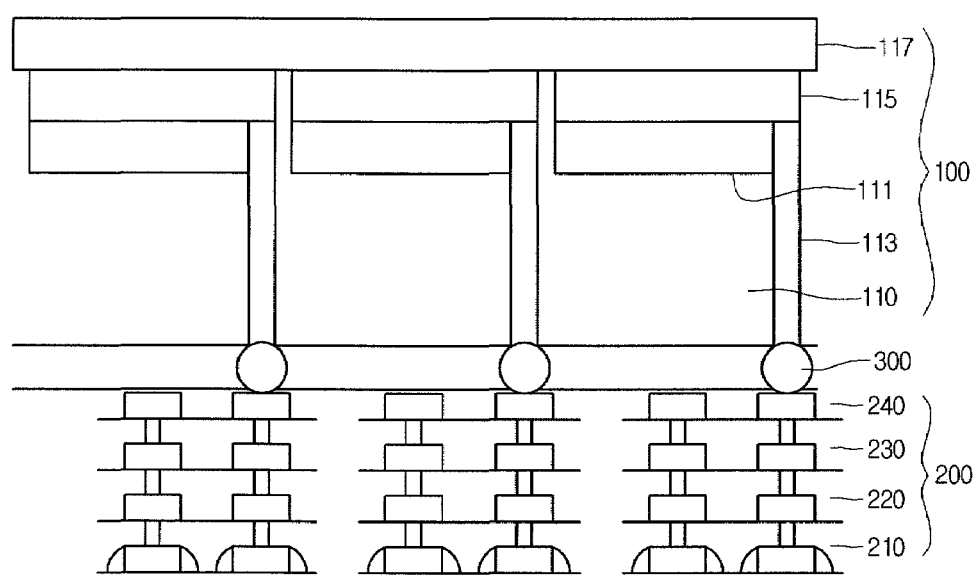
FIG. 4 is a drawing illustrating an image sensor formed through a method of manufacturing an image sensor according to embodiments.

Referring to FIG. 4, in embodiments, first and second substrates 100 and 200 may be stacked. In embodiments, an image sensor may include first substrate 100, second substrate 200, and connection electrodes 300.

In embodiments, connection electrodes 300 may connect photodiode cells 111 formed on first substrate 100 to a logic circuit formed on second substrate 200. Connection electrodes 300 may be electrically connected to photodiode cells 111 by way of through electrodes 113 formed on first substrate 100. Connection electrodes 300 may be connected to an uppermost electrode including third metal layer 240 forming the logic circuit. In embodiments, connection electrodes 300 may be electrically connected to an electrode or a metal layer of the logic circuit.

According to embodiments, as illustrated in FIG. 4, the logic circuit may not be formed on photodiode cells 111 and may be formed on a distinct substrate. In embodiments, photodiode cells 111 may be directly exposed to external light, and may not have any obstructions. Hence, in embodiments an image sensor may not need to have a micro-lens.

If the image sensor is fabricated through a SiP (System In a Package) scheme, certain advantages may be realized. For example, since the photodiode cell area may be formed on the first substrate only, light loss may not occur. Hence, a high-quality image sensor may be obtained.

In addition, in embodiments a process of forming photodiode cells may be performed separately from a process of forming a transistor and/or logic circuit. This may make it possible to form photodiode cells having high performance regardless of any subsequent processes to form a transistor.

Further, since an interlayer dielectric layer and an interconnection layer are not formed on the photodiode cells, in embodiments a micro-lens may not be necessary.

In addition, the distance between the device surface and the photodiode cell may be shortened, which may make it possible to achieve a high quality image sensor without light loss.

Figure 5:
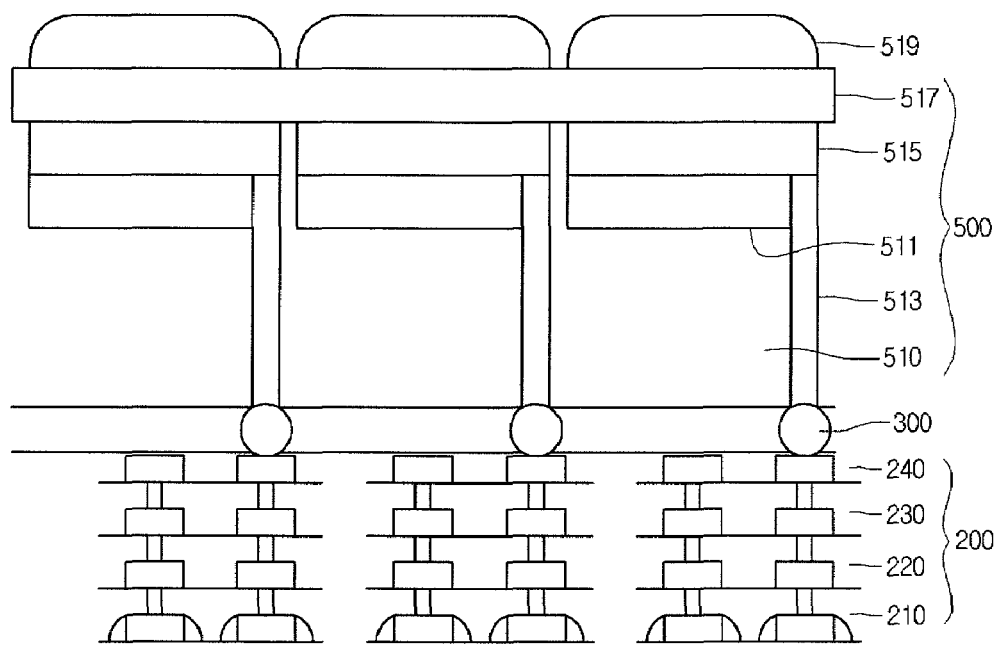
FIG. 5 is a drawing illustrating an image sensor formed through a method of manufacturing an image sensor according to embodiments.

Although the image sensor according to embodiments may not require a micro-lens, a micro-lens 519, as illustrated in FIG. 5, may be provided in embodiments. As shown in FIG. 5, the image sensor according to embodiments may include third substrate 500, second substrate 200 and connection electrodes 300. Connection electrodes 300 may connect photodiode cells 511, which may be formed on third substrate 500, to the logic circuit that may be formed on second substrate 200. Connection electrodes 300 may be electrically connected to photodiode cells 511 by way of through electrodes 513 formed on third substrate 500. In embodiments, connection electrodes 300 may be connected to an uppermost electrode including third metal layer 240 forming the logic circuit.

In embodiments, micro-lens 519 may be formed on an uppermost portion of third substrate 500 to collect light. Photodiode cells 511 may be formed on a semiconductor substrate 510 and color filter 515 may be formed on photodiode cells 511. Protective layer 517 may be formed on color filter 515.

According to embodiments of the image sensor and the method of manufacturing the same, the photosensitivity of the image sensor may be enhanced and a yield rate may be improved.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A device, comprising:
   a photodiode cell over a first semiconductor substrate;
   a color filter over the photodiode cell;
   a through electrode electrically coupled to the photodiode cell and passing through the first semiconductor substrate;
   a logic circuit having a transistor and a metal layer formed on a second substrate;
   an electrode configured to electrically couple the photodiode to the logic circuit, and
   a connection electrode configured to electrically couple the through electrodes to an uppermost metal layer of the metal layer,
   wherein the through electrode comprises at least one of W, Cu, Al, Ag and Au,
   wherein the through electrode, the connection electrode and the metal layer are disposed on the same vertical line.

2. The device of claim 1, wherein the second substrate comprises:
   at least one transistor over a second semiconductor substrate; and
   at least one metal layer over the at least one transistor, wherein the at least one metal layer is electrically coupled to the through electrode.

3. The device of claim 2, wherein the logic circuit is configured to at least one of control the photodiode cell and process light data from the photodiode cell.

4. The device of claim 1, further comprising a micro-lens over the color filter.

5. The device of claim 1, wherein the second substrate comprises:
   a transistor layer comprising at least one transistor over a semiconductor substrate; and
   a metal layer over the transistor layer.

6. The device of claim 1, wherein the logic circuit is configured to at least one of control the photodiode cell and process light data from the photodiode cell.

7. A device, comprising:
   a photodiode cell formed on a first semiconductor substrate;
   a color filter over the photodiode cell;
   a through electrode electrically coupled to the photodiode cell and passing through the first semiconductor substrate;
   a transistor layer comprising at least one transistor over a second semiconductor substrate;
   at least one metal layer over the transistor layer; and
   a connection electrode configured to electrically couple the through electrode to the at least one metal layer,
   wherein the through electrode comprises at least one of W, Cu, Al, Ag and Au,
   wherein the through electrode, the connection electrode, and the metal layer are disposed on the same vertical line.

8. The device of claim 7, wherein the at least one transistor and the at least one metal layer comprise a logic circuit configured to at least one of control the photodiode cell and process light data from the photodiode cell.

9. The device of claim 7, wherein the first semiconductor substrate is stacked over the second semiconductor substrate.

10. The device of claim 7, further comprising a micro-lens over the color filter.

* * * * *